United States Patent
Kendig et al.

(10) Patent No.: US 6,483,319 B1
(45) Date of Patent: Nov. 19, 2002

(54) METHOD OF CONDUCTING BROADBAND IMPEDANCE RESPONSE TESTS TO PREDICT STATOR WINDING FAILURE

(75) Inventors: Martin W. Kendig, Thousand Oaks, CA (US); Daniel N. Rogovin, Thousand Oaks, CA (US)

(73) Assignee: Reliance Electric Technologies, LLC, Mayfield Heights, OH (US)

( * ) Notice: Subject to any disclaimer, the term of this patent is extended or adjusted under 35 U.S.C. 154(b) by 0 days.

(21) Appl. No.: 09/977,753

(22) Filed: Oct. 15, 2001

Related U.S. Application Data

(62) Division of application No. 08/947,120, filed on Oct. 8, 1997.

(51) Int. Cl.[7] .......................... H01H 31/12; G01R 31/34
(52) U.S. Cl. ........................................ 324/551; 324/772
(58) Field of Search ................................ 324/551, 546, 324/544, 545, 547, 520, 772; 336/69; 340/648; 702/57–59

(56) References Cited

U.S. PATENT DOCUMENTS

| | | | |
|---|---|---|---|
| 2,321,424 A | * 6/1943 | Rohats | 324/546 |
| 2,609,419 A | * 9/1952 | Blair | 324/546 |
| 4,200,862 A | 4/1980 | Campbell et al. | 340/310.01 |
| 4,442,393 A | 4/1984 | Abbondanti | 318/802 |
| 5,256,977 A | * 10/1993 | Domenichini et al. | 324/546 |
| 5,257,006 A | 10/1993 | Graham et al. | 340/310.06 |
| 5,512,843 A | * 4/1996 | Haynes | 324/772 |
| 5,519,337 A | 5/1996 | Casada | 324/772 |
| 6,035,265 A | * 3/2000 | Dister et al. | 702/183 |

* cited by examiner

Primary Examiner—Michael Sherry
Assistant Examiner—Russell M. Kobert
(74) Attorney, Agent, or Firm—Himanshu S. Amin; Alexander M. Gerasimow; William R. Walbrun

(57) ABSTRACT

A broadband test procedure detects the onset of stator winding insulation damage, identifies the failure mechanism, determines the winding's susceptibility to further damage, and predicts stator winding failure. This is accomplished by realizing that changes in the stator winding insulation and/or geometry are reflected as changes in the capacitance between the individual windings and, hence, as changes in the stator winding's broadband impedance response. In the currently preferred approach, the impedance response includes the frequency, magnitude, width, and phase of the resonant impedance.

42 Claims, 8 Drawing Sheets

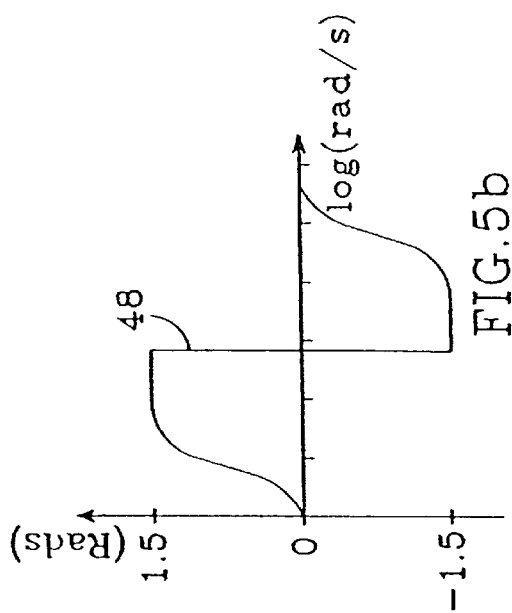
| Failure Mechanisms | | | | |
|---|---|---|---|---|
| Manufacturing | Electrical | Thermal | Mechanical | Environmental |
| Cut Winding Incomplete Webbing Faulty Curing | Dielectric Tracking Corona Transients | Ageing Overload Cycling | Coil Movement Rotor Strike Miscellaneous | Moisture Chemical Abrasion Foreign Objects |
FIG. 4
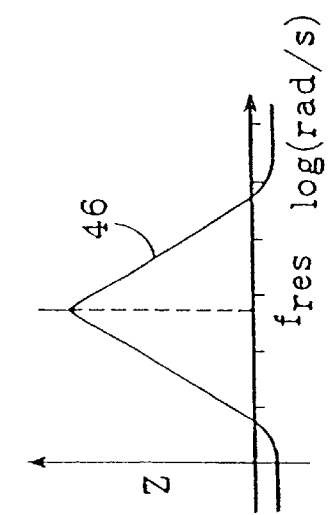
FIG. 5a
FIG. 5b
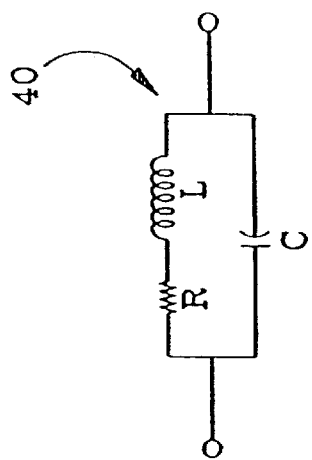
FIG. 2

METHOD OF CONDUCTING BROADBAND IMPEDANCE RESPONSE TESTS TO PREDICT STATOR WINDING FAILURE

CROSS REFERENCE TO RELATED APPLICATION

This application is a divisional patent application of co-pending U.S. patent application Ser. No. 08/947,120, filed Oct. 8, 1997 entitled METHOD OF CONDUCTING BROADBAND IMPEDANCE RESPONSE TESTS TO PREDICT STATOR WINDING FAILURE.

BACKGROUND OF THE INVENTION

1. Field of the Invention

This invention relates to detecting stator winding insulation damage in electric motors and more specifically to a method of detecting the onset of insulation damage, identifying the failure mechanism, determining the winding's susceptibility to further damage, and predicting failure using broadband impedance measurements.

2. Description of the Related Art

Electric motors are used to convert electrical energy into mechanical energy. Permanent magnet field motors have low horsepower (hp) ratings and are used commercially for servo applications such as machine tools, robotics, and high-performance computer peripherals. Of particular interest are higher hp levels required in heavy industry and commercial production lines. For example, polyphase ac induction motors, primarily three-phase, are used to drive fans, pumps, and material handling devices. These motors operate at low frequencies, less than 2 kHz and typically at the 60 Hz frequency provided by the local power company.

FIGS. 1a and 1b illustrate a 3-phase induction motor 10 that converts electrical energy into mechanical energy. As an aside, an induction motor can be operated as a generator which converts mechanical energy into electrical energy. The motor includes a 3-phase stator winding 12 having three separate coils 14a, 14b, and 14c that are physically wound around a stator form 16 at 120 degree intervals and encapsulated in an insulator 18. Each coil includes a large number of wire strands 20 that are individually provided with an insulative sheath. The stator winding 12 is mounted inside a motor housing 22 and does not move. A rotor 24 is wound or provides means for a closed coil 26 and mounted on a set of bearings 28 inside stator winding 12. A drive shaft 30 extends axially from rotor 24 through motor housing 22.

Power delivered by the electric company to industrial plants for large motors is three-phase and is connected to drive coils 14a, 14b, and 14c. At low frequencies, the current flows through the motor's inductance coils such that electrical energy is converted into mechanical energy. Specifically, the induced current flowing through the inductive coils produces a rotating magnetic field that cuts across rotor coil 26 inducing a circulating current in coil 26 that develops its own magnetic field in the rotor. Field intensifiers 32 are positioned around the interior of stator winding 12 to amplify its rotating magnetic field. The interaction between the rotating magnetic field and the rotor field produces the motor action that rotates shaft 30. Sinewave type motors drive the shaft at the line frequency, typically 60 Hz. Inverter type motors convert the fixed frequency line voltage into a controllable-frequency drive voltage so that the shaft can be rotated at different frequencies, typically less than 2 kHz.

In heavy industry and commercial production lines, unexpected motor failure disrupts the line, which wastes time and money, oftentimes results in discarded products, and may damage other online systems. The cost of reconditioning or replacing a motor is negligible compared to the expense associated with an unscheduled shut down. Consequently, commercial production lines are routinely shut down on a fixed maintenance schedule to test the motors and determine whether a component failure has occurred.

A 1985 Electric Power Research Institute (EPRI) study of failure modes in three phase induction motors revealed that 41% of the motors failed because of the rotor bearings, 37% failed due to problems associated with the stator winding insulation, 10% failed from rotor problems and 12% failed for a variety of other reasons. Although the dominant failure mode is bearing failure, stator winding insulation failure is the most significant from a user's perspective because its the most unpredictable. A stator winding failure may cause the motor's performance to degrade or to fail entirely.

A 1985 brochure "Failure in Three-Phase Stator Windings" from Electrical Apparatus Service Association, Inc. (EASA) illustrated the typical winding failures in three-phase stators when exposed to unfavorable operating conditions—electrical, mechanical or environmental. Typical winding failures include a single-phase failure in which one phase of the winding is opened, phase-to-phase shorts, turn-to-turn shorts, winding grounded to the slot (intensifier) and thermal deterioration of insulation. Single-phase failures are usually caused by a blown fuse, an open contactor, broken power line or bad connections. The phase-to-phase, turn-to-turn and grounded winding failures result from contaminants, abrasion, vibration or voltage surges. Thermal deterioration is caused by imbalanced voltages, load demands exceeding the motor's rating, locked rotor condition and power surges.

Current test procedures are conducted off line and coarsely measure degradation in the motor's performance in its low frequency operating range, below 2 kHz, to detect the existence or non-existence of one of these failure modes in the stator winding. Based upon his or her experience, a technician decides whether a failure has occurred and what action to take. The risk is that the motor will fail or severely degrade before it is pulled off the line or that perfectly good motors will be mistakenly rejected. Known test procedures neither detect the onset of the damage that eventually causes one of these stator winding failures, identify the failure mechanism responsible for the damage, determine the winding's susceptibility to further damage, nor predict when failure will occur.

Typically, motors are subjected to partial discharge and surge tests to detect a stator winding failure. In the partial discharge test, a technician discharges a capacitor across the stator winding and observes the time domain voltage response to detect spikes on the 60 Hz envelope. The magnitude of the spikes is a rough indicator of stator winding damage. In the surge test, a technician applies a large voltage pulse to each phase of the winding and compares their time domain current responses to detect asymmetry that is indicative of damage. At best these tests detect whether a failure has occurred, neither is sensitive enough to detect the onset and progression of damage to the winding prior to an actual failure.

SUMMARY OF THE INVENTION

In view of the above problems, the present invention provides a broadband test procedure for detecting the onset of stator winding insulation damage, identifying the failure mechanism, determining the winding's susceptibility to further damage, and predicting stator winding failure.

This is accomplished by realizing that changes in the stator winding insulation and/or geometry are reflected as changes in the capacitance between the individual windings and, hence, as changes in the stator winding's broadband impedance response. These changes may indicate different types of damage to the winding that can cause failure. Furthermore, the broadband impedance response reveals the stator winding's vulnerability to further damage from high frequency signals far above the motor's operating frequency that are typically associated either with line surges or inverter driven motors.

To detect this damage and predict failure, the stator winding is probed at frequencies substantially above its normal operating range where the winding current has a substantial capacitive component that flows between the individual windings and is dissipated in the insulation. The winding may be probed online by either injecting high frequency test signals into the stator winding or using existing high frequency signals common to inverter motors.

Changes in the broadband impedance response indicate the onset of insulation damage and may identify a particular failure mechanism. In the currently preferred approach, the impedance response includes the frequency, magnitude, width, and phase of the resonant impedance. The stator winding's susceptibility to further damage from high frequency waveforms is based on the current value and trend of the impedance response. Furthermore, the impedance response can be used to compute the total dissipated power into the insulation. Any one of these factors or a combination thereof can be used to predict stator winding failure.

These and other features and advantages of the invention will be apparent to those skilled in the art from the following detailed description of preferred embodiments, taken together with the accompanying drawings, in which:

BRIEF DESCRIPTION OF THE DRAWINGS

FIG. 2 is a zeroth order model of the stator winding's broadband impedance;

FIG. 4 is a table of failure mechanisms that cause stator winding insulation damage and eventual failure;

FIGS. 5a and 5b are respectively the zeroth order broadband impedance and phase responses for the motor shown in FIG. 2;

DETAILED DESCRIPTION OF THE INVENTION

The present invention provides a method of conducting a broadband test to detect the onset of stator winding insulation damage, identify the failure mechanism, determine the winding's susceptibility to further damage, and predict stator winding failures of the type described in the EASA brochure. At this point, it is natural to question the applicability of broadband impedance spectroscopy since all electric motors always run at much lower frequencies than the resonance frequency. The answer is one that the damage directly caused by a myriad of failure mechanisms that will eventually cause failure are detectable at high frequencies and two that very strong high frequency waveforms are injected into the stator winding during line surges and in inverter driven motors, for example.

In most cases, insulation failure is either a direct consequence of dielectric breakdown or changes in the winding geometry. Applicants realized that changes in the dielectric or geometry are reflected as changes in the capacitance between the individual stator windings and hence as changes in the stator winding's broadband impedance response. Thus, a change in impedance response can be used to detect the onset of damage and predict winding failure. To detect these changes, the stator winding must be probed over a broad frequency band substantially above its normal operating range where the capacitive component becomes significant. Furthermore, the impedance response can be used to compute the dissipated power in the insulation.

Figures 1A, 1B:
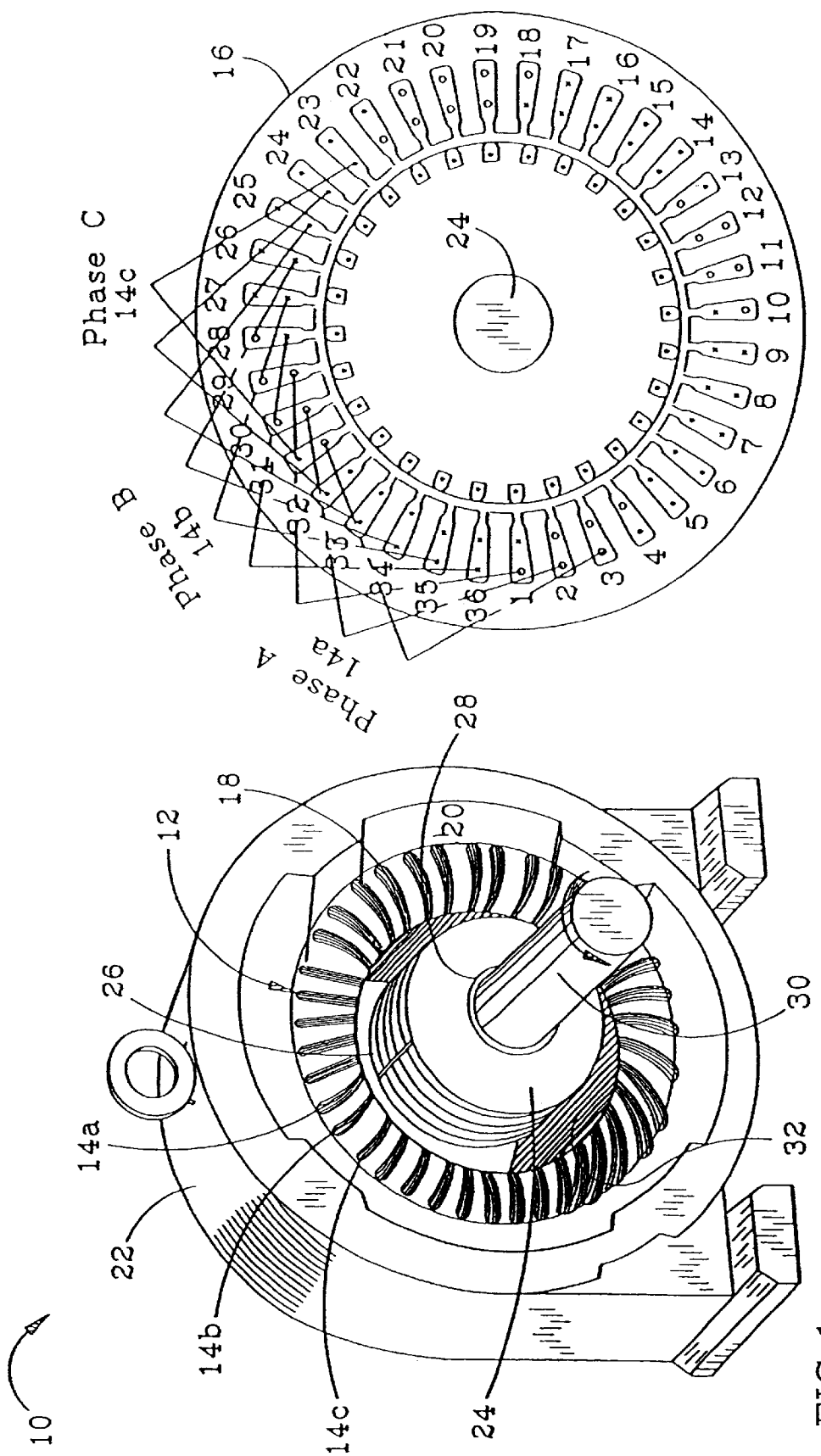
FIGS. 1a and 1b, as described above, are respectively sectional views of a known 3-phase induction motor and its unwound stator.

FIG. 2 is a simple zeroth order broadband electrical model 40 of the stator winding 12 shown in FIGS. 1a and 1b. The model includes an inductor L that represents the inductance of the stator winding connected in series with a resistor R that represents the resistance of the stator winding. This series R-L circuit is the conventional model used to analyze the stator and is accurate in the motor's operating frequency range. At low frequencies, the current flows through the motor inductance and gives rise to the power conversion from electrical energy to mechanical energy that spins the rotor.

A stator winding failure may produce a measurable change in either the resistance or inductance at these low frequencies. However, mere damage to the insulation prior to actual failure will not produce a measurable change in these parameters or the motor's impedance response. Thus, the failure mechanism cannot be identified nor failure predicted based upon this model.

Applicants have enhanced the conventional model by connecting a capacitor C that represents the capacitance between the stator winding's individual windings in parallel with the series R-L circuit. At frequencies in the motor's operating frequency range, the capacitor is effectively an open circuit such that the model defaults to the conventional series R-L circuit. However, at high enough frequencies the winding current has a significant capacitive component that flows between the individual windings where it is converted into thermal energy and dissipated in the insulation. As a result, changes, i.e. damage, to the stator winding insulation that change its dielectric constant or its geometry will produce a measurable change in the motor's broadband impedance response.

Figure 3:
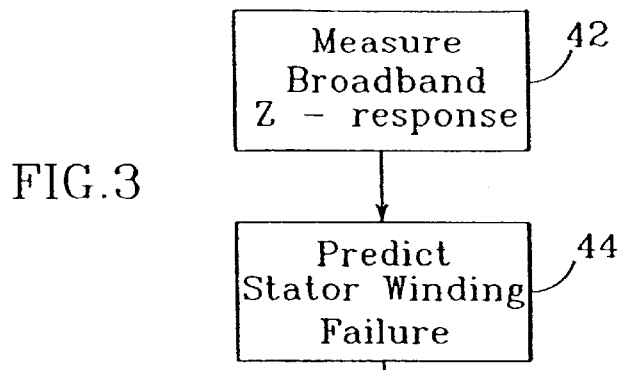
FIG. 3 is a flowchart illustrating the method of detecting the onset of insulation damage and predicting failure using broadband impedance measurements.

As illustrated in FIG. 3, in its broadest sense, the invention teaches measuring the stator winding's broadband impedance response (step 42) and, based upon the impedance response, predicting stator winding failure (step 44).

How the impedance response is measured depends upon the particular application. For example, manufacturing defects of the type listed in FIG. 4 typically induce a relatively small change in the impedance response. Therefore, newly manufactured motors are preferably tested off-line where the frequency of the probe signal can be swept across the broadband to finely resolve the impedance. Conversely, the degradation caused by the electrical, thermal, mechanical and environmental failure mechanisms of the type also listed in FIG. 4 typically cause a significant degradation. As a result, the impedance response can be generated by probing the stator winding with a discrete set of frequencies and then interpolating over the broadband. Although this approach provides less resolution, it has the advantage of not having to shut the line down. The stator winding can be probed by injecting high frequency signals or by using the existing high frequency components of the driver waveform. Alternately, a current pulse can be injected into the windings and the a impedance response calculated using a FFT.

The broadband impedance response is measured at frequencies above the motor's operating frequency range where the winding current has a significant capacitive component, typically above approximately $0.3 \times F_{res}$ where $F_{res}=1/(LxRe[C])^{1/2}$ is the stator winding's resonant frequency. In general, this reveals the envelope of the broadband impedance response. More specifically, the frequency $F_{res}$, peak magnitude $Z_{peak}=(L/Abs[C])^{1/2}$, width W=f (dielectric loss), and phase $\Phi$ of the resonant impedance have been identified with particular failure mechanisms. These parameters are illustrated in FIGS. 5a and 5b, which depict the ideal impedance 46 and phase 48 responses for the model shown in FIG. 2. Applicants believe that it will be possible to associate higher order harmonics and non-harmonic frequencies with these or other as yet undiscovered failure mechanisms.

Figure 6A:
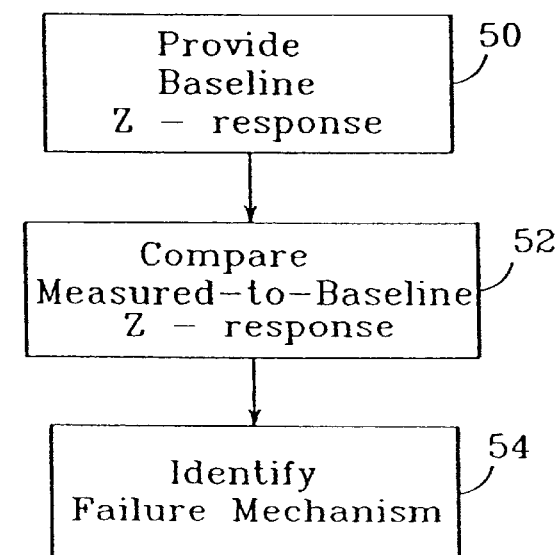
FIGS. 6a and 6b are respectively flowcharts illustrating the methods for predicting stator winding failure based on the comparison of the broadband impedance response to a baseline response and the total power dissipated in the stator winding to a target value.
Figure 6A:
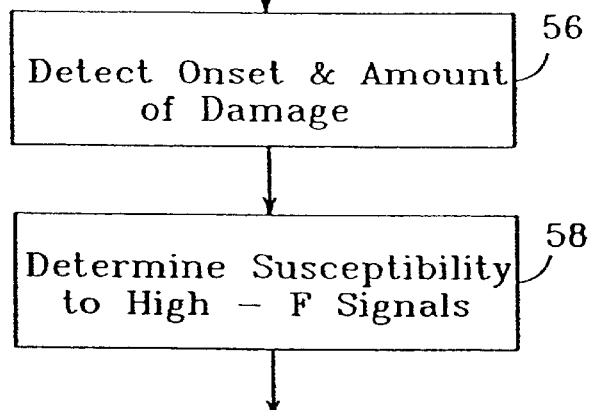
Figure 6B:
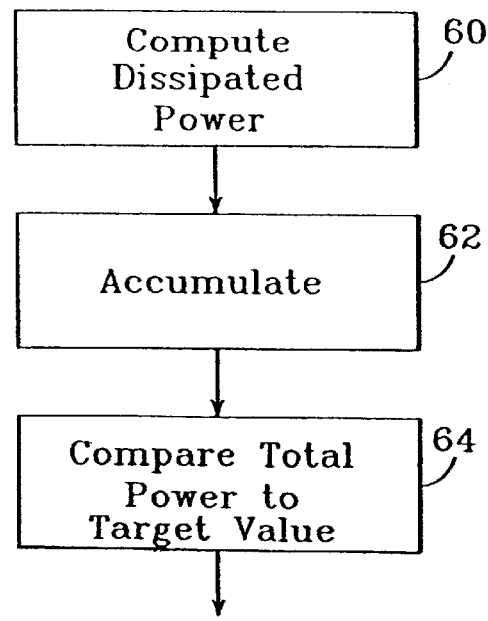

Stator winding failure can be predicted based upon any one of several features of the impedance response or any combination thereof. The first approach, as described in detail in FIG. 6a, is to compare the stator winding's measured broadband impedance response to a baseline response and use that information to identify specific failure mechanisms, estimate the amount of damage, and determine the winding's susceptibility to further damage from high frequency waveforms. The second approach, as described in detail in FIG. 6b, is to calculate the total power dissipated into the stator winding insulation as an indicator of damage. Even absent one of the failure mechanisms listed in FIG. 4, the stator winding will dissipate power causing it to age naturally and eventually fail. The failure mechanisms merely accelerate the aging process in a previously unpredictable manner. These approaches provide a technician or computer with a lot of detailed information on which to base an accurate prediction of stator winding failure. As a result, the frequency of unexpected line shutdowns and the rejection of perfectly good motors are reduced.

In the first approach, a baseline impedance response is provided (step 50) as shown in FIG. 6a. With new motors, the baseline can be a historical value, a modeled value or the average of the lot from which the stator winding was drawn. Thereafter, each accepted new motor is tested to define its own baseline response or "birth certificate" that travels with the motor for its lifetime. Alternately, the lot average, historical, or modeled values could be used.

The measured broadband impedance response is compared to this baseline response (step 52). With new motors, if the difference between the baseline and measures values, either the entire envelope or specific parameters, exceeds a tolerance, the motor is rejected. This prevents motors whose power efficiencies are too low and expected lifetimes are too short from being introduced into the commercial market. Once in operation, deviations from the baseline response can be used to identify one or more of the failure mechanisms listed in FIG. 4 (step 54).

The various failure mechanisms will affect the impedance response in measurably different ways. For example, different changes in the overall envelope shape and the resonant frequency, peak and width over time and under different thermal conditions correspond to certain failure mechanisms. The ability to identify a particular failure mechanism will assist in assessing the amount of damage to the insulation, determining the susceptibility to further damage, and predicting when the winding will fail.

The magnitude of the deviations from baseline indicate the onset of insulation damage and, with certain failure mechanisms, indicate the amount of damage to date (step 56). Generally, the greater the deviation the greater the damage. The onset and amount of damage are both factors in predicting stator winding failure.

The measured impedance response and the trend over past measurements indicate the stator winding's susceptibility to further damage from high frequency waveforms (step 58). If the width of the impedance response has increased and the phase degraded to the point that either a power surge or continued exposure to high frequency waveforms would cause imminent failure the motor may be pulled from the line. The identification of the failure mechanism, the amount of damage and the susceptibility to further damage are all factors in predicting stator winding failure.

In the second approach illustrated in FIG. 6b, the power dissipated into the winding (step 60) is computed by measuring either the voltage across or the current flowing through the stator winding, using the measured impedance response to calculate the power dissipated in the insulation at each frequency, and integrating the total power over the broadband frequencies. The power levels are then accumulated over time (step 62) to estimate the total power dissipated into the insulation. The total is compared to a target value (step 64) to detect the onset of damage, estimate the amount of damage, and predict failure. The target value can be determined from historical data for similar motors. This approach has the advantage of being relatively simple and is not dependent upon identifying the failure mechanism. When the total power exceeds the target, the motor is pulled from the line. In some applications it may be desirable to use both approaches to analyze and predict stator winding failure.

By way of example and without loss of generality, cut winding, moisture, and thermal aging/cycling; specifically percolation and thermal ionization, failure mechanisms are described in FIGS. 7–12 to illustrate the invention. However, the broadband impedance response test will be applicable to additional failure mechanisms as they are discovered and characterized. These figures specifically illustrate the changes in broadband impedance response that pertain to onset, identification, and susceptibility. However, the general degradation in impedance and phase response will also increase the amount of power dissipated into the insulation. Most importantly none of the failure mechanisms discussed nor the damage caused by them would be observable at the low frequencies associated with normal motor operation.

Figure 7:
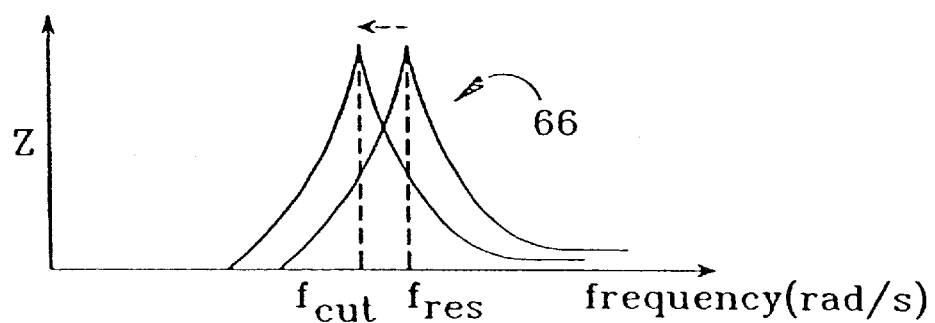
FIG. 7 is a plot illustrating a stator winding's broadband impedance response when cut during manufacturing.

Occasionally, the stator winding is damaged when the motor is wound. The damage is in the form of small cuts in the insulation material and can happen literally anywhere in the windings. It is virtually impossible to detect such damage as there are kilometers of windings in the motor and a small cut does not alter the visual appearance in any obvious manner. However, even a small cut will alter the geometry of the winding in the sense that the effective area of the capacitance associated with the stator winding will increase. As shown in FIG. 7, this increase in capacitance will shift the peak of the impedance response 66 to a lower frequency $f_{cut}$ relative to the baseline resonant frequency $f_{res}$. Because there is no significant loss introduced by such a cut, the magnitude, width, and phase of the peak will remain unchanged. Thus, when this pattern occurs, prior to use, a technician or computer can identify the defect as a cut winding. The magnitude of the frequency shift indicates the severity of the damage and will dictate whether the winding is rejected or accepted.

Figure 8A:
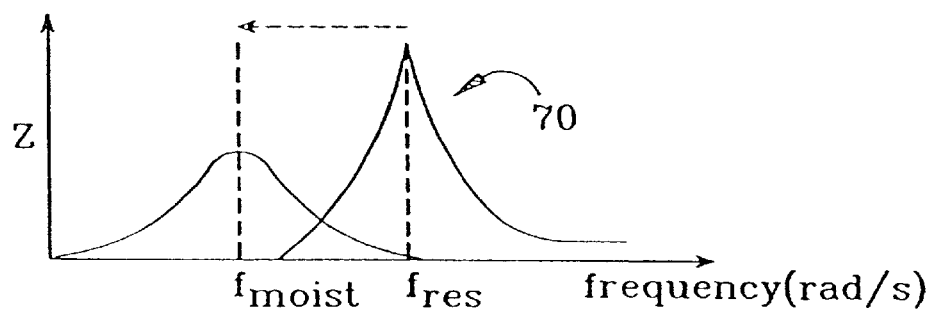
FIGS. 8a and 8b are respectively plots illustrating a stator winding's baseline broadband impedance and phase responses and its response when exposed to moisture.

In some applications, the motor will be exposed to moisture that permeates into the stator winding insulation. The moisture increases the dielectric constant of the insulation and makes it more lossy. As a result, the resonant frequency $f_{res}$ of the impedance response 70 shifts to a lower frequency $f_{moist}$ and its peak amplitude is reduced and widened relative to the baseline response as shown in FIG. 8a. A reduction in peak amplitude to 10% of its original value with a corresponding widening by a factor of ten has been observed. When observed, this pattern is identified as the moisture failure mechanism. The extent of the shift and widening indicates how much moisture has permeated the insulation.

Figure 8B:
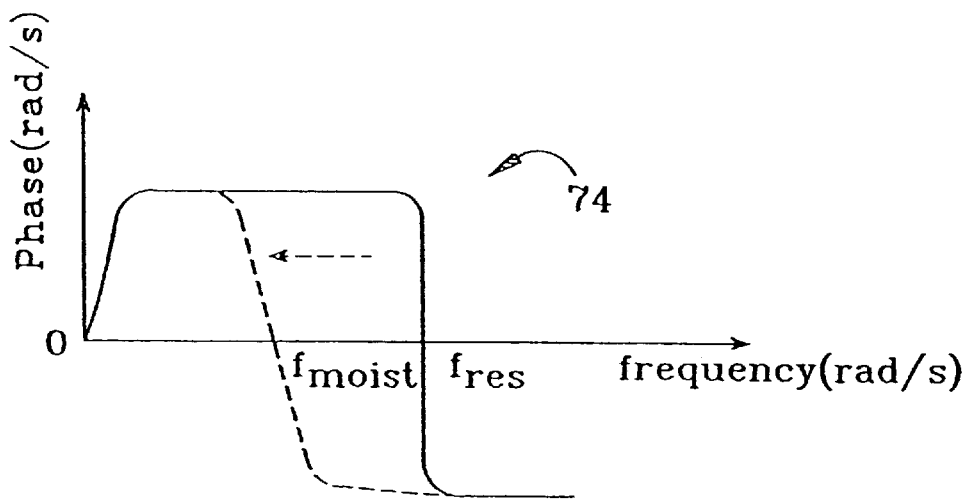

As shown in FIG. 8b, the phase response 74 has not only shifted to the lower frequency $f_{moist}$ relative to the baseline response but has softened the transition between its inductive and capacitive regions. Because the power dissipated in the insulation is the cosine of the phase angle divided by the absolute value of the impedance, this softening coupled with the reduction and widening of the peak greatly increases power dissipation.

Thermal cycling can accelerate the aging effects of the stator winding insulation. Specifically, carbon and ceramic based insulation materials exhibit "percolation" and "thermal ionization" effects, respectively, that damage the insulation and increase power dissipation. Other materials that have impurities may exhibit thermal ionization as well.

With carbon based insulation, as the temperature increases above room temperature the polymer C—H bonds are broken and the hydrogen outgasses to the ambient environment. As hydrogen leeches out of the polymer, it forms carbon rich granular regions within and on the surface of the insulation leaving the internal structure somewhat altered. Because the granular regions are electrically connected at high temperatures they have a large surface area relative to the original uniform dielectric medium, and thus collectively have a much higher capacitance than the individual windings. However, at room temperature electrons cannot tunnel between granular regions and thus they are not electrically connected.

Figure 9:
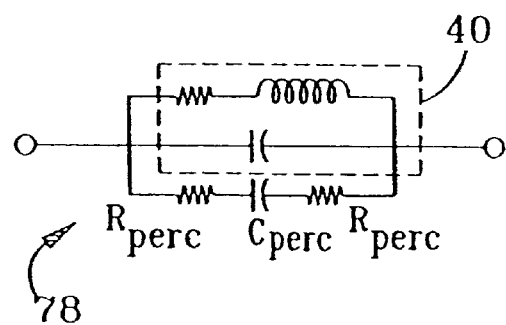
FIG. 9 is a zeroth order model of a percolation effect in the stator winding insulation.

The percolation effect is modeled by connecting a series R-C-R circuit 78 in parallel with the basic model 40 as shown in FIG. 9. The capacitor $C_{perc}$ represents the collective capacitance of the regions at temperature. The variable resistors $R_{perc}$ model the temperature varying properties of the path between granular regions. At low temperatures, $R_{perc}$ is very high so that the percolation capacitance is not seen. Conversely at high temperatures, $R_{perc}$ is very low so that the percolation capacitance dominates.

Figure 10A:
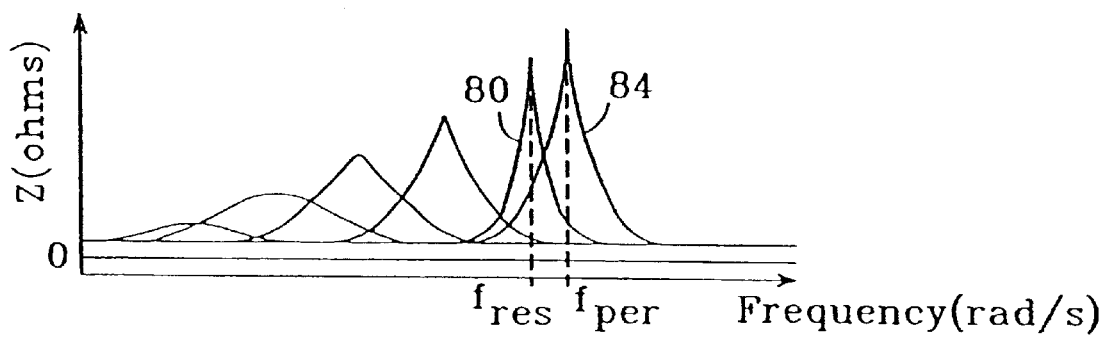
FIGS. 10a and 10b are respectively plots illustrating a stator winding's baseline broadband impedance and phase responses and its response when exhibiting percolation effects.
Figure 10B:
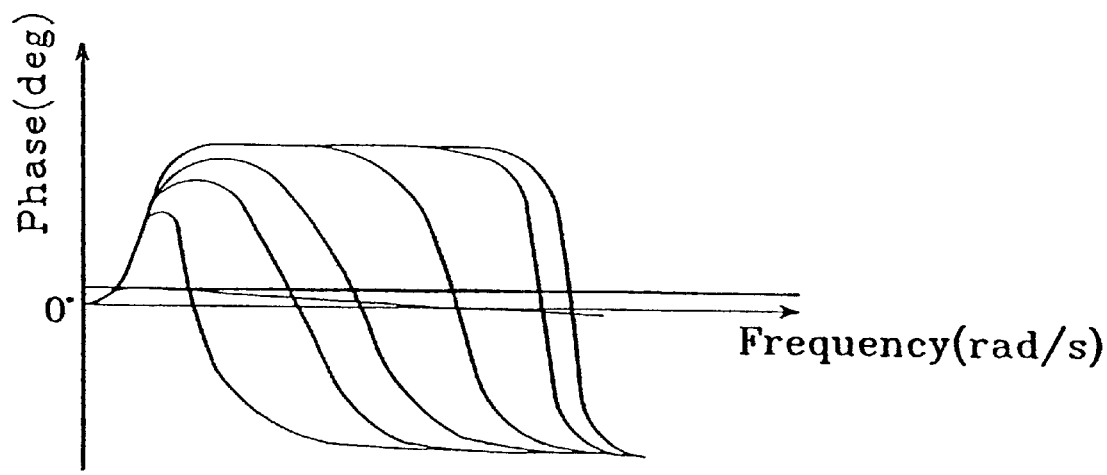

Thus, as shown in FIGS. 10a and 10b, at room temperature, approximately 26 degrees C., the stator winding exhibits baseline impedance and phase responses 80 and 82, respectively. As the temperature increases up to approximately 300 degrees C., the resistance between granular regions is reduced allowing electron tunneling to occur. As an increasing percentage of the current is diverted through this secondary conduction path, the resonant frequency shifts downward, the peak amplitude drops, the peak broadens, and the phase response degrades. As a result, the stator winding dissipates a lot of power into the insulation.

When the stator winding returns to room temperature, the electrons cannot tunnel between granular regions and the individual winding capacitance controls. Since some of the hydrogen is irreversibly outgassed, the insulation is permanently altered. This lowers the dielectric constant and shifts the frequency of the peak upwards to a frequency $f_{perc}$. The width of the peak and the phase transition are the same as their original values because even though the carbon regions are still present they are no longer capable of supporting current at these low temperatures.

The percolation failure mechanism can be identified by the distinctive irreversible upwards shift in the resonant frequency and/or by the changes in the impedance response during thermal cycling over a wide temperature range, 26–300 degrees C. The former can be done on or off line whereas the latter must be performed on line. The insulation is damaged both by the alterations made due to outgassing and by power dissipation. The magnitude of the irreversible shift is an indicator of the degree of alteration and total power dissipated in the insulation due to the percolation effect. If the insulation is weakened too much by outgassing or power dissipation it may fail.

Figure 11:
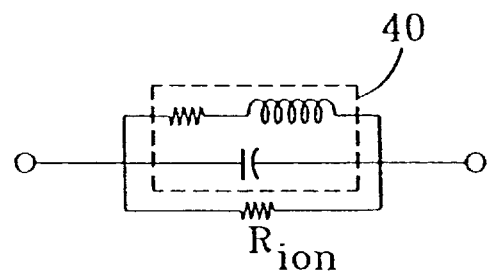
FIG. 11 is a zeroth order model of a thermal ionization effect in a ceramic stator winding insulation.

With some types of insulation such as ceramics, the impurities in the insulation become ionized when heated. The formation of thermally excited ions provides an additional conductive path, which is modeled by connecting a resistor $R_{ion}$ in parallel with the basic stator winding model 40 as shown in FIG. 11. In the winding tested, the additional path was not formed until the temperature exceeded approximately 155 degrees centigrade. Above that threshold temperature, the resistance of the path decreases rapidly with temperature and increases with frequency.

Figure 12A:
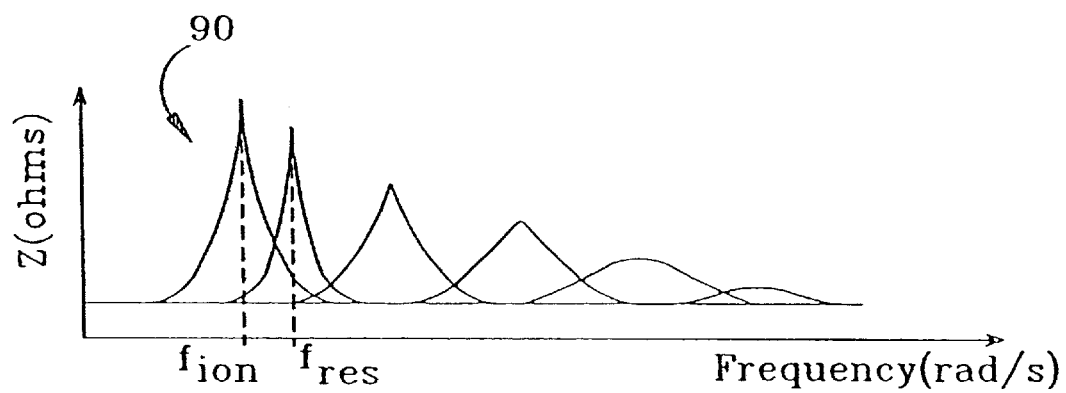
FIGS. 12a and 12b are respectively plots illustrating a stator winding's broadband impedance and phase response when exhibiting thermal ionization.
Figure 12B:
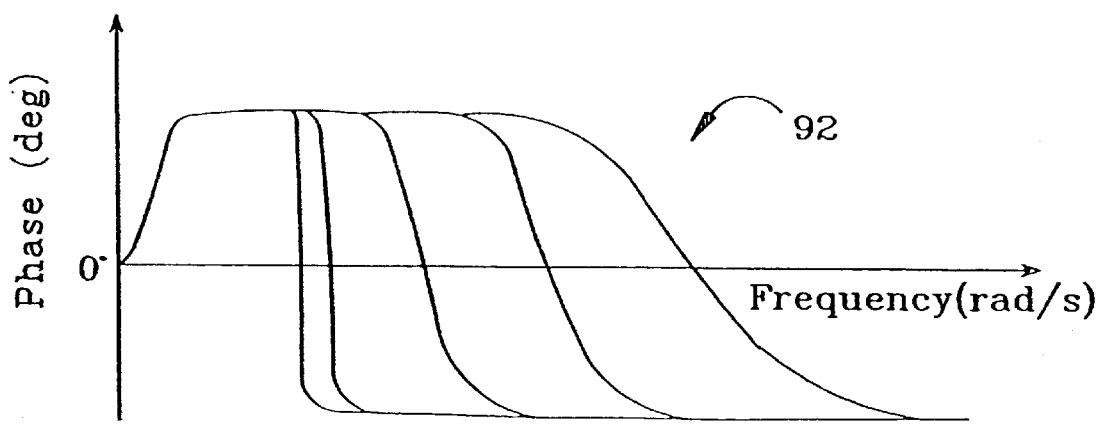

Above the threshold, the resistor $R_{ion}$, shorts out the individual winding capacitance thereby shifting the frequency $f_{res}$ of the resonant impedance 90 to a higher value as shown in FIG. 12a. As the temperature increases to 187 degrees, the peak drops to approximately 10% of its baseline value and widens by a factor of ten. The phase response 92 degrades as shown in FIG. 12b, which indicates that power is being dissipated into the insulation.

As the temperature is reduced back to room temperature, the impedance curve retraces its path with the peak frequency migrating back down with a corresponding reduction in width and increase in amplitude. However, at the room temperature, the impedance peaks at a lower frequency $f_{ion}$ than its original value $f_{res}$, with a greater amplitude and narrower width. This "final" state is only temporary. The impedance returns to its initial value over the full range of frequencies within about a day.

The thermal ionization mechanism is identified in ceramic or similar insulation materials by 1) the upwards shift and corresponding widening of the peak impedance over a fairly narrow temperature range, 2) the return to a lower resonant frequency $f_{ion}$ at room temperature, and 3) the eventual return to the baseline values over the broadband. The stator winding is damaged by the power dissipated into the insulation during the thermal cycle. This effect must be monitored on-line and, like the others, can only be seen at high frequencies.

The electric motors to which these broadband impedance response techniques apply are typically either a sinewave motor or an inverter motor. The only difference being how the two motors are driven. The sinewave motor is driven directly off the 60 Hz sinewave supplied by the power company. The inverter motor includes an inverter that converts the 60 Hz sinewave into a controllable-frequency output waveform for driving the motor.

Figure 13:
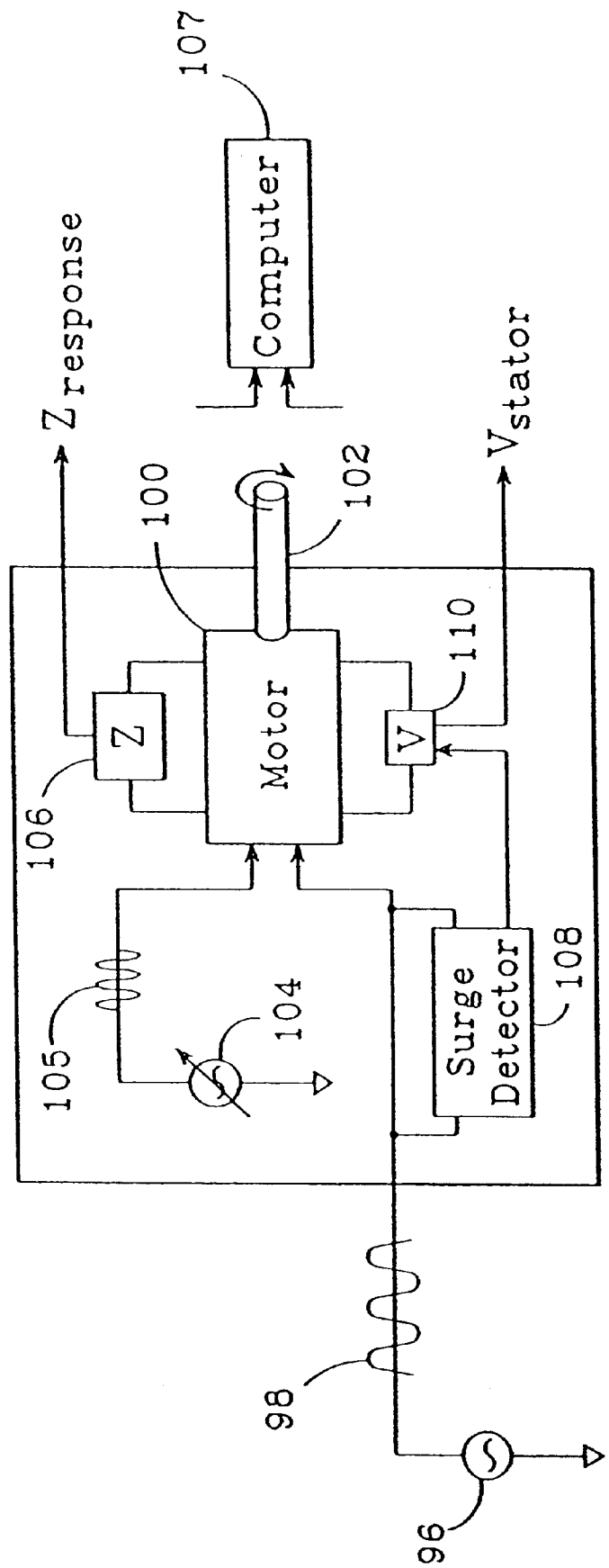
FIG. 13 is a simplified schematic of a sinewave motor with a local oscillator for measuring the impedance response on line.

FIG. 13 illustrates one embodiment of a sinewave motor assembly 94 for monitoring the broadband impedance on-line and accumulating the power dissipated in the stator winding. A source 96 generates a three-phase voltage waveform 98, typically 60 Hz, that is input to assembly 94 and drives the electric motor 100, which rotates shaft 102 at 60 Hz. A local oscillator 104 generates a set of discrete frequency probe signals 105, typically at least three different frequencies distributed around the resonant frequency, and injects them into the motor's stator winding. The probe signal frequencies are much higher than the waveform frequency and thus they do not interact.

An impedance meter 106 measures the stator winding's impedance response to the probe signals, either continuously or periodically, and transmits the impedance response to a computer 107 for analysis. A surge detector 108 monitors the incoming three-phase waveform for surges in the line voltage that contain very strong high frequency components might damage the motor. If detected, a voltage (current) meter 110 measures the transient voltage (current) across the motor 100 during the surge, and transmits it to the computer. The computer may be located locally but most facilities will network a large number of motors such that a centralized computer system is more efficient. The computer uses the impedance and voltage/current data to compute the broadband impedance response and total dissipated power from which a technician or the computer can detect the onset of insulation damage, identify the failure mechanism, determine susceptibility to further damage, and predict stator winding failure.

Figure 14A:
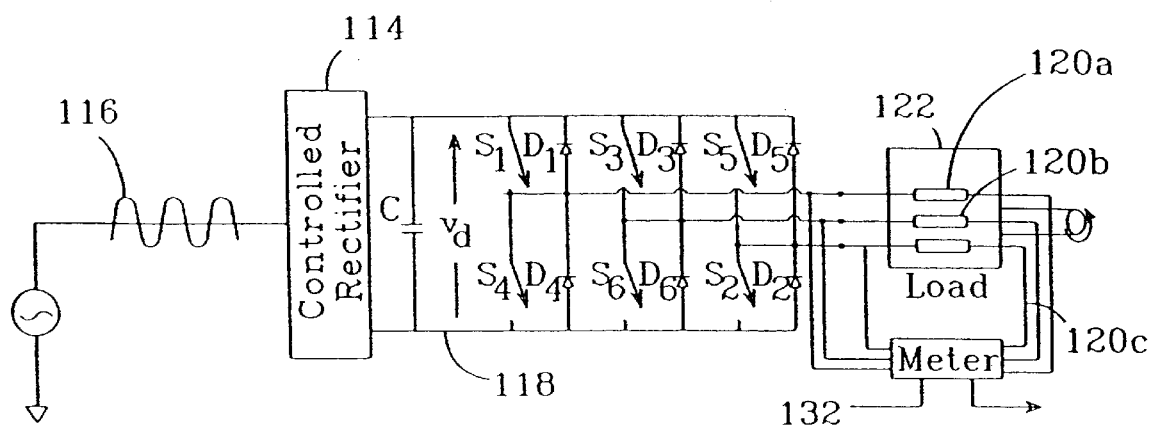
FIGS. 14a through 14e are respectively a simplified schematic of a three-phase voltage-source inverter for driving a motor, the three different pulse waveforms, the superimposed waveform, and the filtered waveform.

As shown in FIG. 14a, a sample inverter motor 112 includes a controlled rectifier 114 that rectifies the 60 Hz waveform 116 to provide a direct-voltage source. An inverter 118 includes three pair of series connected diodes D1–D6 that are connected in parallel across the rectifier 114 and three pair of series connected self-commutated switches S1–S6 that are connected in parallel across the rectifier 114 with their center taps connected to the respective center taps of the diode pairs. A large capacitor C is connected across the direct-voltage link between the rectifier 114 and the inverter 118.

Figure 14B:
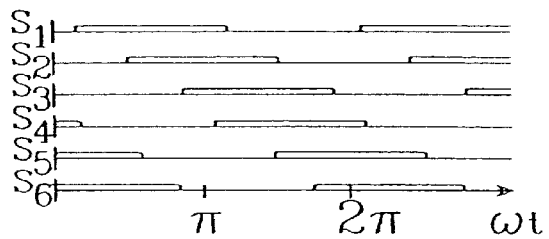

In this inverter, the switches are turned on in the sequence in which they are numbered as shown in FIG. 14b. Each is held ON for just under one-half cycle and then is turned OFF. This causes three switches to be conducting at any time, two connected to one side of the rectifier and one to the other. When any switch is ON, it and the diode connected in antiparallel with it constitute an effective short circuit. Thus, with two switches in the ON condition connected to one side of the rectifier, there is a short circuit between two of the three stator windings 120a, 120b and 120c of the motor 122.

Figure 14C:
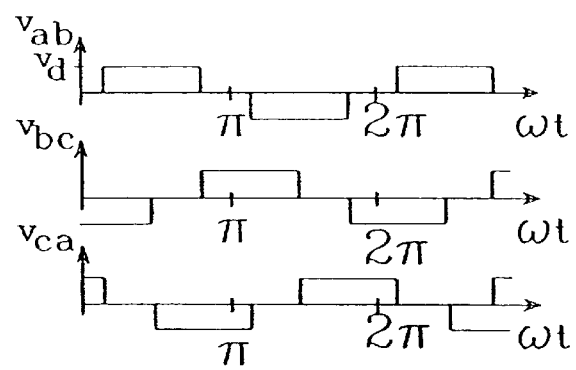
Figure 14D:
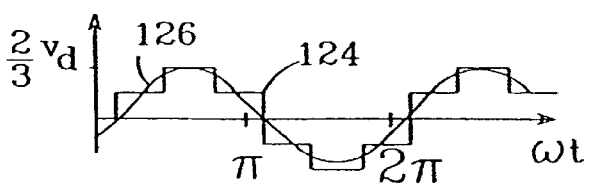
Figure 14E:
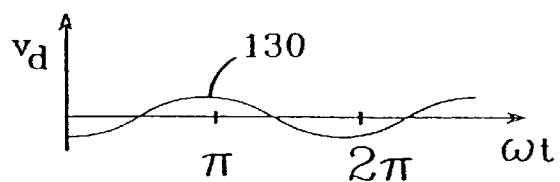

The three-phase waveforms $v_{ab}$, $v_{bc}$, and $v_{ca}$ are shown in FIG. 14c and consist in each half-cycle of a square wave of voltage equal in magnitude to the direct-link voltage $V_d$ across the capacitor and having a duration of 120 degrees. Normally, the three-phase system will be balanced. With two phases short circuited together during each 60 degree interval, the direct-link voltage vd is distributed with two-thirds of its magnitude across one phase and the remaining third across the two parallelled phases. A typical six-step waveform 124 that is produced by the superposition of the three component waveforms and its low pass filtered version 126 are shown in FIG. 14d. The other phases are delayed by ⅔ and ⅘ pi, respectively, and together produce the motor force that rotates shaft 128 at the desired frequency. The current waveform 130 through the corresponding winding lags the phase voltage due to the inductive nature of the stator winding at low frequencies. The frequency of the six-step waveform is controlled by setting the switching speed of the self-commutated switches.

Although the output frequency can be varied it remains at a relatively low frequency, below 2 kHz and typically near 60 Hz. However, the individual waveforms have very steep edges and thus very high frequency components that can be used as "probe" signals. A meter 132 measures the motor's response, both impedance and voltage, to the probe signals and passes the data to a computer for analysis. The computer uses the impedance and voltage data to compute the broadband impedance response and total dissipated power from which a technician or the computer can detect the onset of insulation damage, identify the failure mechanism, determine susceptibility to further damage, and predict stator winding failure.

While several illustrative embodiments of the invention have been shown and described, numerous variations and alternate embodiments will occur to those skilled in the art. For example, generators are merely motors operated in reverse; mechanical energy imparted to the rotor producing electrical energy in the stator winding. Thus, the claims should be well understood by those skilled in art to cover generators as well as motors. Such variations and alternate embodiments are contemplated, and can be made without departing from the spirit and scope of the invention as defined in the appended claims.

We claim:

1. A method of detecting stator winding insulation damage in an induction motor, comprising:

providing a baseline impedance response for the induction motor's stator winding, said response being defined over a broadband at frequencies above the motor's operating frequency range at which current flowing through the stator winding has a significant capacitive component due to the capacitance between its individual windings;

probing the stator winding at a plurality of frequencies in said broadband to determine its measured impedance response;

comparing the measured and baseline impedance responses to detect the onset of damage to the stator winding insulation, to identify the failure mechanism that causes the damage, and to determine the stator winding's heightened susceptibility to further damage from high frequency signals.

2. The method of claim 1, wherein the magnitude, frequency, and width of the stator winding's resonant impedance are measured and compared to like parameters in the baseline impedance response.

3. The method of claim 2, wherein the induction motor is new so that any damage to the stator winding insulation is attributable to the manufacturing process, said broadband impedance response being measured by sweeping the frequency of a probe waveform across the broadband to reveal fine deviations in the magnitude, frequency, and width of the stator winding's resonant impedance from the baseline response that are indicative of manufacturing induced damage and then accept or reject the motor based upon those changes.

4. The method of claim 3, further comprising:
identifying a downward shift in the frequency and magnitude of the resonance impedance without a change in its width as a cut in the stator winding insulation; and
rejecting said stator winding when the amount of damage indicated by said downward shift is too large.

5. The method of claim 2, further comprising:
predicting stator winding failure based upon the identified failure mechanism and a historical trend of the heightened susceptibility to further damage from high frequency waveforms.

6. The method of claim 5, wherein when operating online the induction motor is exposed to one or more electrical, thermal, mechanical and environmental failure mechanisms that may damage the stator winding insulation over time, said broadband impedance response being measured prior to placing the induction motor online to define the baseline response, the subsequent measurements of said broadband impedance response revealing changes in the magnitude, frequency, and width of the stator winding's resonant impedance as compared to the baseline response that are indicative of a particular failure mechanism, the amount of direct damage to the stator winding insulation up to that point, and the heightened susceptibility.

7. The method of claim 6, further comprising:
identifying a permanent downward shift in the frequency and magnitude of the resonance impedance with a corresponding increase in width as moisture in the stator winding insulation, said stator winding failure being predicted based upon the size of said shift, which is indicative of the amount of moisture in the insulation.

8. The method of claim 5, wherein the stator winding insulation includes a carbon based polymer that irreversibly outgasses hydrogen atoms as the motor ages and undergoes thermal cycling causing hydrogen atoms to leech out of the polymer leaving behind alterations in the insulation that reduce the individual winding capacitance and forming carbon rich granular regions within and on its surface that exhibit a much higher capacitance than the individual windings at high temperatures where the current can tunnel between regions and that appear as approximately an open circuit at low temperatures where tunneling is inhibited, said stator winding failure being predicted based upon the upward shift in frequency of the resonance impedance at low temperature as indicative of the degree of alterations in the insulation and the heightened susceptibility during thermal cycling to damage from high frequency signals that would dissipate in the insulation.

9. The method of claim 8, wherein the heightened susceptibility of said insulation is determined by measuring the downward shift and widening of the resonant impedance while the motor is online and undergoing thermal cycling.

10. The method of claim 8, wherein this outgassing failure mechanism is identified by the upward shift in frequency of the resonant impedance when returned to a low temperature.

11. The method of claim 5, wherein the stator winding insulation includes impurities that are ionized by heat during thermal cycling thereby providing an additional conduction path whose resistance increases with frequency and is reduced with increasing temperature, said broadband impedance response being measured online during thermal cycling to detect the upward shift and widening of the resonant impedance that indicate the heightened susceptibility of the stator winding insulation to damage from high frequency waveform components, said prediction of stator winding failure being based upon said upward shift and widening of the resonant impedance.

12. The method of claim 11, further comprising identifying this thermal ionization failure mechanism by a) the upward shift and widening of the resonant impedance during thermal cycling, b) the downward shift and narrowing of the resonant impedance when initially returned to a low temperature, and c) the reversibility of the resonant impedance to its previous values after a period of time.

13. The method of claim 1, further comprising performing the stator winding probing while the motor is off-line.

14. The method of claim 1, further comprising performing the stator winding probing while the motor is on-line.

15. The method of claim 1, further comprising identifying that the damage to the insulation material is a cut in the material, the identifying being based at least in part upon the cut altering winding geometry so that an effective area of capacitance associated with the stator winding increases.

16. The method of claim 1, the motor being a sinewave motor.

17. The method of claim 16, further comprising employing an oscillator to generate probe signals.

18. The method of claim 1, the motor being an inverter motor.

19. The method of claim 18, further comprising employing an inverter in connection with generating probe signals.

20. A method of detecting stator winding insulation damage in an induction motor, comprising:
measuring a broadband impedance response of the induction motor's stator winding to probe for damage prior to stator winding failure, said stator winding being probed at frequencies above the motor's operating frequency range at which current flowing through the stator winding has a significant capacitive component due to the capacitance between its individual windings, said capacitive component being dissipated in and thereby damaging said stator winding insulation; and
determining the susceptibility of said stator winding insulation to further damage from high frequency waveforms that could cause stator winding failure.

21. The method of claim 20, further comprising predicting stator winding failure based upon the susceptibility of said stator winding to further damage.

22. The method of claim 21, further comprising measuring the total dissipated power over time in said stator winding insulation, said stator winding failure being predicted based upon the total dissipated power and said susceptibility.

23. A method of detecting stator winding insulation damage in an induction motor, comprising:
measuring the induction motor's impedance response while on-line, said response being defined over a broadband at frequencies above the motor's operating frequency range at which current flowing through the stator winding has a significant capacitive component due to the capacitance between its individual windings;

computing the dissipated power in said stator winding over said broadband based upon the measured impedance;

accumulating the total dissipated power in said stator winding over time; and comparing the total dissipated power to a target value to predict stator winding failure.

24. The method of claim 23, wherein the induction motor is driven by a sinewave voltage waveform whose frequency is substantially below said broadband, further comprising detecting power surges in said voltage waveform that inject high frequency waveform components into said stator winding insulation that produce capacitive components of the current and measuring the broadband impedance response during the power surge.

25. The method of claim 23, wherein an inverter superimposes a plurality of pulse waveforms to produce a waveform for driving the induction motor in its operating frequency range, said pulse waveforms having steep rising and falling edges that comprise high frequency signal components, which produce capacitive components of the current that are dissipated in said stator winding insulation.

26. A method of detecting stator winding insulation damage in an induction motor, comprising:

providing a baseline impedance response for the induction motor's stator winding, said response being defined over a broadband at frequencies above the motor's operating frequency range at which signal current flowing through the stator winding has a significant capacitive component due to the capacitance between its individual windings, said capacitance being sensitive to changes in the stator winding insulation;

running the motor in its operating frequency where it is exposed to one or more electrical, thermal, mechanical and environmental failure mechanism that may damage the stator winding insulation over time thereby accelerating power dissipation in the insulation;

measuring the induction motor's impedance response over said broadband while on-line;

computing the dissipated power in said stator winding over said broadband based upon the measured impedance response;

accumulating the total dissipated power in said stator winding over time; and comparing a) the total dissipated power to a target value and b) the measured impedance response to the baseline response to detect the onset of damage to the stator winding insulation, identify the failure mechanism that is causing the damage, estimate the present amount of damage to the insulation, determine the insulation's susceptibility to further damage from high frequency signal components, and predict stator winding failure.

27. The method of claim 26, wherein the magnitude, frequency, and width of the stator winding's resonant impedance are measured and compared to like parameters in the baseline impedance response.

28. The method of claim 27, further comprising:

identifying a permanent downward shift in the frequency and magnitude of the resonance impedance with a corresponding increase in width as moisture in the stator winding insulation, said stator winding failure being predicted based upon the size of said shift, which is indicative of the amount of moisture in the insulation.

29. The method of claim 27, wherein the stator winding insulation includes a carbon based polymer that irreversibly outgasses hydrogen atoms as the motor ages and undergoes thermal cycling causing hydrogen atoms to leech out of the polymer leaving alterations in the insulation that reduce the individual winding capacitance and forming carbon rich granular regions within and on its surface that exhibit a much higher capacitance than the individual windings at high temperatures where the current can tunnel between regions and that appear as approximately an open circuit at low temperatures where tunneling is inhibited, said stator winding failure being predicted based upon the upward shift in frequency of the resonance impedance at low temperature as indicative of the degree of alterations formed in the insulation and the heightened susceptibility during thermal cycling to damage from high frequency signals that would dissipate in the insulation.

30. The method of claim 29, wherein the heightened susceptibility of said insulation is determined by measuring the downward shift and widening of the resonant impedance while the motor is online and undergoing thermal cycling.

31. The method of claim 29, wherein this outgassing failure mechanism is identified by the upward shift in frequency of the resonant impedance when returned to a low temperature.

32. The method of claim 27, wherein the stator winding insulation includes impurities that are ionized by heat during thermal cycling thereby providing an additional conduction path whose resistance increases with frequency and is reduced with increasing temperature, said broadband impedance response being measured online during thermal cycling to detect the upward shift and widening of the resonant impedance that indicate the heightened susceptibility of the stator winding insulation to damage from high frequency signal components, said prediction of stator winding failure being based upon said upward shift and widening of the resonant impedance.

33. The method of claim 32, further comprising identifying this thermal ionization failure mechanism by a) the upward shift and widening of the resonant impedance during thermal cycling, b) the downward shift and narrowing of the resonant impedance when initially returned to a low temperature, and c) the reversibility of the resonant impedance to its previous values after a period of time.

34. A method of detecting stator winding insulation damage in an induction motor, comprising:

probing the stator winding at a plurality of frequencies over a broadband that lies above the motor's operating frequency range and at which current flowing through the stator winding has a significant capacitive component due to the capacitance between its individual windings;

measuring the stator winding's broadband impedance response including its resonant impedance; and detecting changes in the stator winding's resonant impedance to determine changes in the stator winding insulation.

35. The method of claim 34, wherein measuring the broadband impedance response includes measuring the magnitude, frequency, and width of the stator winding's resonant impedance.

36. The method of claim 35, wherein changes in the resonant impedance's magnitude, frequency, and width are caused by changes in the capacitance between the individual windings which is indicative of damage to the insulation, further comprising:

identifying a failure mechanism based upon the changes in the resonant impedance's magnitude, frequency, and width; and estimating the amount of damage to the insulation based upon the magnitude of those changes.

37. The method of claim 35, wherein changes in the resonant impedance's magnitude, frequency, and width are caused by changes in the capacitance between the individual windings which is indicative of damage to the insulation, further comprising:

determining the susceptibility of said insulation to further damage from high frequency signals based upon the present values of the resonant impedance's magnitude, frequency, and width.

38. The method of claim 37, wherein the susceptibility of said insulation to further damage from high frequency signals is determined based upon the historical trends of the values of the resonant impedance's magnitude, frequency, and width.

39. A method of detecting stator winding insulation damage in an inverter-type induction motor, comprising:

superimposing a plurality of pulse waveforms to produce a waveform for driving the induction motor in an operating frequency range, said pulse waveforms' steep rising and falling edges producing high frequency signal components that lie in a broadband above the motor's operating frequency range and at which current flowing through the stator winding has a significant capacitive component due to the capacitance between its individual windings;

monitoring on-line the stator winding's impedance response over the broadband in response to said high frequency waveform components to detect the onset of stator winding insulation damage; and predicting stator winding failure based upon the stator winding's broadband impedance.

40. The method of claim 39, further comprising comparing the measured impedance response to a baseline response to identify a failure mechanism that a) has damaged the insulation and b) heightens its susceptibility to further damage from said high frequency signal components that dissipate in the insulation.

41. The method of claim 40, further comprising determining the magnitude, frequency, and width of the stator winding's resonant impedance and comparing them compared to like parameters in the baseline response to identify the failure mechanism and amount of damage to the insulation.

42. The method of claim 39, further comprising:

computing the dissipated power in said stator winding over said broadband based upon the measured impedance response;

accumulating the total dissipated power in said stator winding over time; and comparing the total dissipated power to a target value to predict stator winding failure.

* * * * *